(12) United States Patent
Lai

(10) Patent No.: US 12,334,462 B2
(45) Date of Patent: Jun. 17, 2025

(54) SEMICONDUCTOR STRUCTURE FOR WAFER LEVEL BONDING AND BONDED SEMICONDUCTOR STRUCTURE

(71) Applicant: UNITED MICROELECTRONICS CORP., Hsin-Chu (TW)

(72) Inventor: Chien-Ming Lai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/429,477

(22) Filed: Feb. 1, 2024

(65) Prior Publication Data

US 2024/0178171 A1    May 30, 2024

Related U.S. Application Data

(63) Continuation of application No. 17/382,325, filed on Jul. 21, 2021, now Pat. No. 11,929,335.

(30) Foreign Application Priority Data

Jun. 11, 2021  (CN) .......................... 202110652095.5

(51) Int. Cl.
*H01L 23/00*    (2006.01)

(52) U.S. Cl.
CPC .............. *H01L 24/08* (2013.01); *H01L 24/05* (2013.01); *H01L 24/80* (2013.01); *H01L 2224/05016* (2013.01); *H01L 2224/05147* (2013.01); *H01L 2224/08145* (2013.01); *H01L 2224/80895* (2013.01); *H01L 2224/80896* (2013.01); *H01L 2924/01029* (2013.01); *H01L 2924/05042* (2013.01); *H01L 2924/05442* (2013.01); *H01L 2924/351* (2013.01)

(58) Field of Classification Search
CPC .................... H01L 24/08; H01L 24/05; H01L 2224/80895; H01L 2224/80896; H01L 21/185

See application file for complete search history.

(56) References Cited

U.S. PATENT DOCUMENTS

| | | | |
|---|---|---|---|
| 6,252,178 B1 * | 6/2001 | Hashemi | H05K 1/0206 174/262 |
| 9,640,509 B1 * | 5/2017 | Yang | H01L 24/08 |
| 10,312,201 B1 | 6/2019 | Hu | |
| 10,418,314 B2 | 9/2019 | Lu | |

(Continued)

FOREIGN PATENT DOCUMENTS

| | | |
|---|---|---|
| CN | 109326596 | 2/2019 |
| CN | 109755212 A | 5/2019 |
| CN | 110690202 A | 1/2020 |

*Primary Examiner* — Mamadou L Diallo
(74) *Attorney, Agent, or Firm* — Winston Hsu

(57) ABSTRACT

A semiconductor structure for wafer level bonding includes an interconnecting layer on a substrate, a bonding dielectric layer on the interconnecting layer, and a bonding pad in the bonding dielectric layer. The bonding pad includes a top surface exposed from the bonding dielectric layer, a bottom surface opposite to the top surface and physically contacting a dielectric portion of the interconnecting layer, and a sidewall between the top surface and the bottom surface. A bottom angle between the sidewall and the bottom surface is smaller than 90 degrees, and the bonding pad is not electrically connected to the interconnecting layer.

20 Claims, 5 Drawing Sheets

(56) References Cited

U.S. PATENT DOCUMENTS

| | | |
|---|---|---|
| 10,593,677 B2 | 3/2020 | Chang |
| 2003/0089521 A1* | 5/2003 | Lee ........................ H05K 3/243 |
| | | 174/250 |
| 2013/0020704 A1* | 1/2013 | Sadaka ................... H01L 24/03 |
| | | 438/455 |
| 2018/0240859 A1* | 8/2018 | Yang ....................... H01L 24/05 |
| 2020/0006266 A1* | 1/2020 | Chen ................... H01L 23/5283 |
| 2020/0006275 A1* | 1/2020 | Chen ....................... H01L 24/80 |
| 2020/0083175 A1* | 3/2020 | Hongo .................... H01L 24/07 |
| 2020/0395339 A1 | 12/2020 | Chen |
| 2021/0028137 A1 | 1/2021 | Jeon |
| 2021/0098405 A1 | 4/2021 | Chu |
| 2021/0296269 A1* | 9/2021 | Sharangpani ........... H01L 24/06 |
| 2021/0375790 A1* | 12/2021 | Oda ........................ H01L 24/80 |
| 2021/0375791 A1* | 12/2021 | Oda ..................... H01L 23/564 |
| 2022/0199559 A1* | 6/2022 | Fang ....................... H01L 24/09 |
| 2022/0336394 A1* | 10/2022 | Ishikawa ................. H01L 24/06 |
| 2022/0352441 A1* | 11/2022 | Lutgen ................... H01L 24/08 |
| 2022/0359456 A1* | 11/2022 | Chen ................. H01L 21/76898 |

* cited by examiner

SEMICONDUCTOR STRUCTURE FOR WAFER LEVEL BONDING AND BONDED SEMICONDUCTOR STRUCTURE

CROSS REFERENCE TO RELATED APPLICATIONS

This application is a continuation application of U.S. application Ser. No. 17/382,325, filed on Jul. 21, 2021. The content of the application is incorporated herein by reference.

BACKGROUND OF THE INVENTION

1. Field of the Invention

The present invention relates to semiconductor technology, and more particularly to a semiconductor structure for wafer level bonding and a bonded semiconductor structure.

2. Description of the Prior Art

A 3D IC refers to a three-dimensional stack of chips formed by using wafer-level bonding and through-silicon-via (TSV) technologies. In comparison with conventional two-dimensional chips, a 3D IC may have the advantages of using the space more effectively, shorter signal transmission distances between chips, and lower interconnecting resistances. 3D ICs have gradually become the mainstream technology of power converters, low noise amplifiers, radio frequency (RF) or millimeter wave (MMW) components. However, current 3D ICs still have problems to be improved, such as abnormal signal transmission caused by defective bonding between the bonding pads.

SUMMARY OF THE INVENTION

In light of the above, the present invention is directed to provide a semiconductor structure for wafer level bonding and a bonded semiconductor structure having bonding pads with trapezoid shapes, which may ensure an intimate contact between the bonded bonding pads of the bonded semiconductor structure. The bonding pads with trapezoid shapes may also reduce the stress occurred at the bonding interface. Accordingly, an improved bonding quality may be obtained.

According to an embodiment of the present invention, a semiconductor structure for wafer level bonding is provided, which includes an interconnecting layer on a substrate, a bonding dielectric layer on the interconnecting layer, and a bonding pad in the bonding dielectric layer. The bonding pad includes a top surface exposed from the bonding dielectric layer, a bottom surface opposite to the top surface and physically contacting a dielectric portion of the interconnecting layer, and a sidewall between the top surface and the bottom surface, wherein a bottom angle between the sidewall and the bottom surface is smaller than 90 degrees, and the bonding pad is not electrically connected to the interconnecting layer.

According to another embodiment of the present invention, a bonded semiconductor structure including a first deice wafer and a second device wafer is provided. The first deice wafer includes a first interconnecting layer on a first substrate, a first bonding dielectric layer on the first interconnecting layer, and a first bonding pad through the first bonding dielectric layer and physically contacting a dielectric portion the first interconnecting layer, wherein the first bonding pad is not electrically connected to the first interconnecting layer. The second device wafer includes a second interconnecting layer on a second substrate, a second bonding dielectric layer on the second interconnecting layer and bonded to the first bonding dielectric layer, and a second bonding pad in the second bonding dielectric layer and bonded to a top surface the first bonding pad, wherein a first angle between the top surface and a sidewall of the first bonding pad is larger than 90 degrees.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
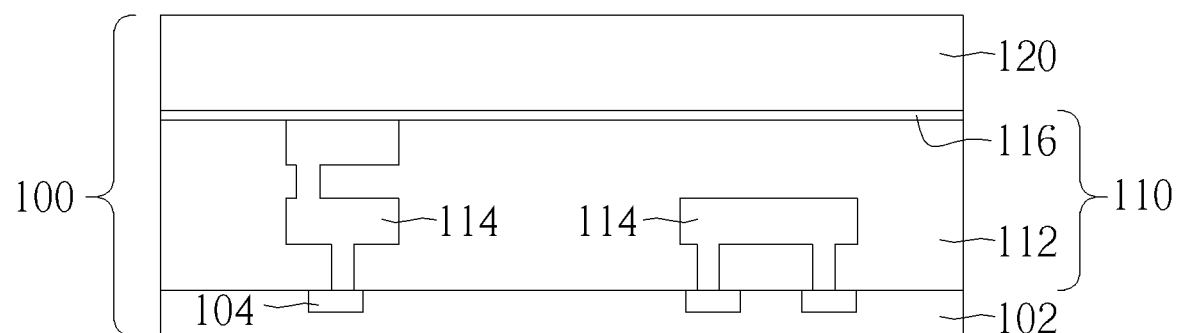
FIG. 1 to FIG. 5 are schematic cross-sectional diagrams illustrating the steps of forming a semiconductor structure for wafer level bonding and a bonded semiconductor structure according to a first embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

It should be readily understood that the meaning of "on", "above", "over" and the like in the present disclosure should be interpreted in the broadest manner such that these terms not only means "directly on something" but also includes the meaning of "on something with an intermediate feature or a layer therebetween".

Furthermore, spatially relative terms, such as "beneath", "below", "under", "lower", "above", "upper", "on", "over" and the like may be used herein to describe one element or feature's spatial relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

FIG. 1 to FIG. 5 are schematic cross-sectional diagrams illustrating the steps of forming a semiconductor structure for wafer level bonding and a bonded semiconductor structure according to a first embodiment of the present invention. Please refer to FIG. 1. A first device wafer 100 is provided. The first device wafer 100 may include a substrate 102, an interconnecting layer 110 on the substrate 102, and a bonding dielectric layer 120 on the interconnecting layer 110. The substrate 102 may be a silicon substrate, a silicon-on-insulator (SOI) substrate, a silicon germanium (SiGe) substrate, a III-V semiconductor substrate, or a substrate made of other suitable materials. A plurality of semiconductor devises 104 may be formed in the substrate 102. The semiconductor devises 104 may include transistors, diodes, capacitors, inductors, resistors, and/or any other types of active or passive electrical components, but are not limited thereto. The interconnecting layer 110 may include a dielectric portion 112 and a plurality of interconnecting structures 114 formed in the dielectric portion 112. The dielectric portion 112 may include a multilayer structure made of dielectric materials such as silicon oxide, silicon nitride, carbon-doped silicon nitride, low-k dielectric materials, or a combination thereof, but are not limited thereto. The interconnecting structures 114 may include conductive materials, such as copper (Cu), aluminum (Al), tungsten (W), titanium (Ti), titanium nitride (TiN), tantalum (Ta), tantalum nitride (TaN), other conductive metals or metal compounds, or a combination thereof, but is not limited thereto. The semiconductor devises 104 may be electrically connected to other electrical components or external circuits (not shown) through the interconnecting structures 114. In some embodiments, the interconnecting layer 110 may further include electrical components (not shown) such as capacitors, inductors, resistors, embedded memories, but are not limited thereto. The bonding dielectric layer 120 may include a dielectric material such as silicon oxide, silicon nitride, or other dielectric materials suitable for wafer level bonding process. According to an embodiment of the present invention, the bonding dielectric layer 120 may include silicon oxide. In some embodiments, the interconnecting layer 110 may include an etching stop layer 116 disposed between the dielectric portion 112 and the bonding dielectric layer 120. The etching stop layer 116 may include silicon nitride.

Figure 2:
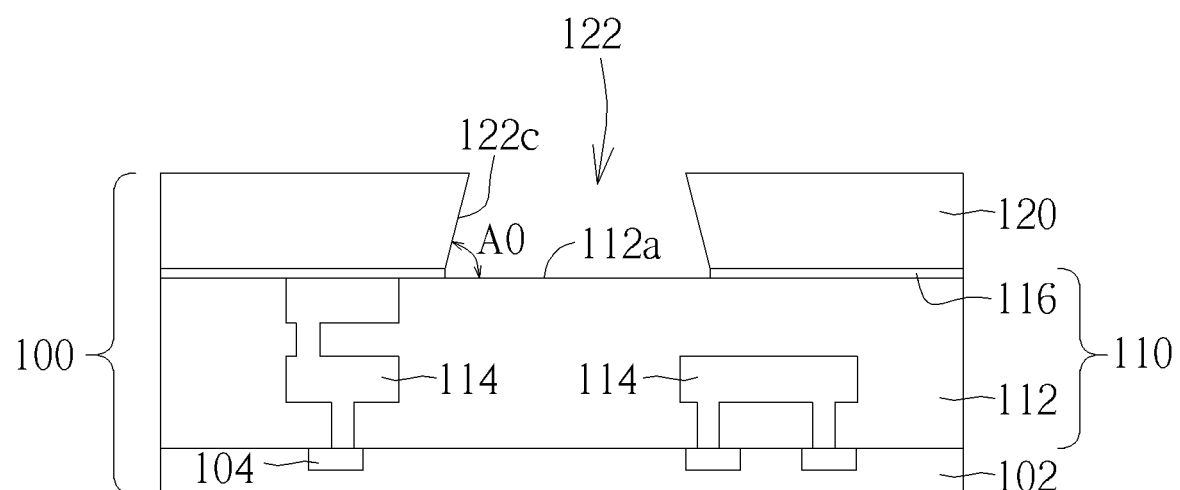

Please refer to FIG. 2. Subsequently, a patterning process may be performed to form an opening 122 through the bonding dielectric layer 120 and the etching stop layer 116 until exposing a surface 112a of the dielectric portion 112 (or a surface of the interconnecting structures 114 according to other embodiments) of the interconnecting layer 110. The patterning process may be a photolithography-etching process to transfer the pattern of the opening 122 from a photoresist layer (not shown) to the bonding dielectric layer 120 and the etching stop layer 116. For example, after forming the photoresist layer (not shown) on the bonding dielectric layer 120, an etching process is performed, using the photoresist layer as an etching mask to etch the bonding dielectric layer 120 until the stop layer 116 is exposed. Subsequently, an over-etching step may be performed to etch through the etching stop layer 116 until the surface 112a of the dielectric portion 112 (or a surface of the interconnecting structures 114 according to other embodiments) is exposed. By adjusting the process parameters of the etching process to control the lateral removal rate of the bonding dielectric layer 120, the opening 122 may be formed in a trapezoid shape, having a bottom angle A0 between the sidewall 122a and the surface 112a of the dielectric portion 112 smaller than 90 degrees. According to an embodiment of the present invention, the bottom angle A0 may be between 60 and 85 degrees, but is not limited thereto.

Figure 3:
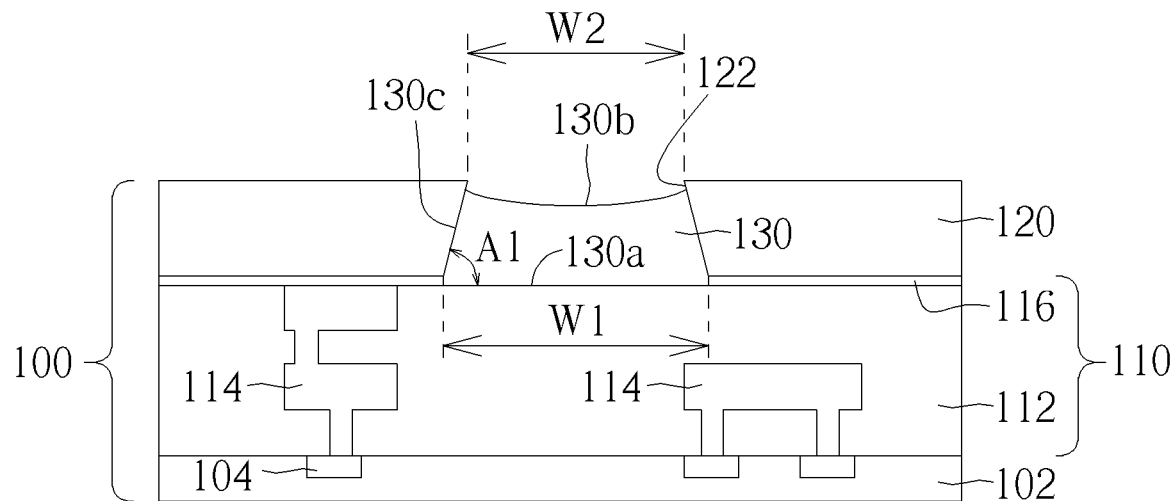

Please refer to FIG. 3. Subsequently, a conductive material layer (not shown) may be formed on the bonding dielectric layer 120 and fills the opening 122. A chemical mechanical polishing (CMP) process may be performed to remove the portion of the conductive material layer outside the opening 122 until the surface of the bonding dielectric layer 120 is exposed, thereby obtaining a bonding pad 130 in the opening 122. The material of the bonding pad 130 (the material of the conductive material layer) may include a metal suitable for wafer level bonding, such as copper (Cu). According to an embodiment of the present invention, the CMP process may include over-polish to ensure that the conductive material layer outside the opening 122 may be completely removed and no conductive material layer is remained on the surface of the bonding dielectric layer 120. As a result, a top portion of the bonding pad 130 may be removed, and the top surface 130b of the bonding pad 130 may have a recessed (or dishing) profile lower than the surface of the bonded dielectric layer 120. The recessed depth of the top portion of the bonding pad 130 may be adjusted as required by controlling the CMP process. In some embodiments, as shown in FIG. 3, the top portion of the bonding pad 130 may be recessed to a deeper depth such that the edge of the top surface 130b of the bonding pad 130 may be lower than the surface of the bonded dielectric layer 120 and the upper side wall of the opening 122 may be exposed. In other embodiments, the top portion of the bonding pad 130 may be recessed to a shallower depth such that the edge of the top surface 130b of the bonding pad 130 may be approximately flush with the surface of the bonded dielectric layer 120.

Please continue to refer to FIG. 3. The semiconductor structure (the first device wafer 100) for wafer level bonding according to the first embodiment of the present invention includes a substrate 102, an interconnecting layer 110 disposed on the substrate 102, and a bonding dielectric layer 120 disposed on the interconnecting layer 110. The substrate 102 may include a plurality of semiconductor devices 104. The semiconductor devices 104 may be electrically connected to each other and/or to external circuits (not shown) through the interconnecting structures 114 formed in the interconnecting layer 110. A bonding pad 130 is disposed in the bonding dielectric layer 120. The bonding pad 130 penetrates through the bonding dielectric layer 120 and the etching stop layer 116 and includes a bottom surface 130a, a top surface 130b opposite to the bottom surface 130a, and a sidewall 130c between the bottom surface 130a and the top surface 130b. The top surface 130b is exposed from the surface of the bonding dielectric layer 120 for forming bonding with an associated bonding pad of another semiconductor structure (for example, the second device wafer 200 shown in FIG. 4 and FIG. 5) through a wafer level bonding process. In some embodiments, the bottom surface 130a may directly contact the dielectric portion 112 of the interconnecting layer 110. In some embodiments, the bottom surface 130a of the bonding pad 130 may directly contact and electrically connect to an interconnecting structure 114 (shown in FIG. 9) of the interconnecting layer 110 to transmit signal of the first device wafer 100. In some embodiments, the bonding pad 130 may be a dummy bonding pad that is not electrically connect to the interconnecting structures 114 and has no signal transmission function. In some cases, the dummy bonding pads may be used to improve heat dissipation and/or provide electrical shielding to the first device wafer 100. In some cases, the dummy bonding pads may also improve the bonding between the semiconductor structures (device wafers). It is noteworthy that the bonding pad 130 of the present invention has a trapezoid shape, wherein the width W1 of the bottom surface 130a is larger than the width W2 of the top surface 130b. The bottom angle A1 between the sidewall 130c and the bottom surface 130a of the bonding pad 130 is smaller than 90 degrees. According to an embodiment of the present invention, the width W1 may be 1.1 to 1.3 times of the width W2, and the bottom angle A1 may be between 60 and 85 degrees, but are not limited thereto.

Figure 4:
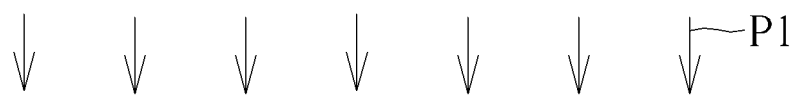
Figure 4:
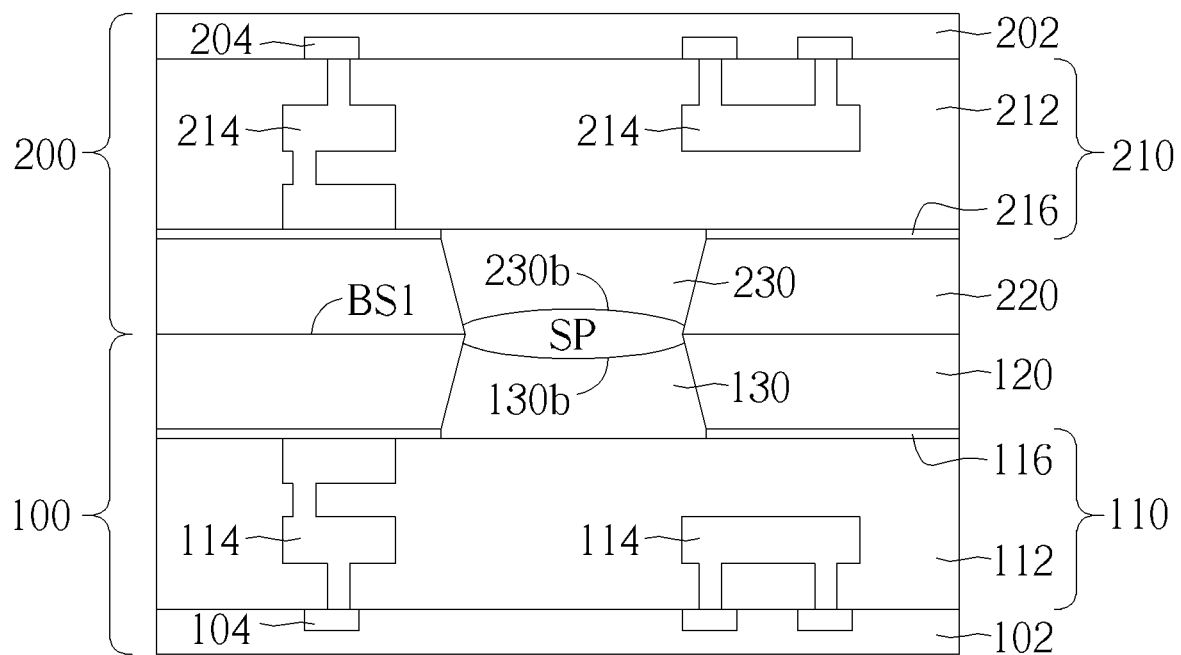

Please refer to FIG. 4. Another semiconductor structure such as a second device wafer 200 is provided, and an alignment process P1 is performed to arrange the second device wafer 200 on the first device wafer 100 in an orientation that a bonding dielectric layer 220 of the second device wafer 200 is opposite to the bonding dielectric layer 120 of the first device wafer 100 and a bonding pad 230 of the second device wafer 200 is aligned to the bonding pad 130 of the first device wafer 100, allowing the first device wafer 100 and the second device wafer 200 in contact with each other on the contact interface BS1. In some embodiments, a surface cleaning process may be performed to the surfaces of the bonding dielectric layer 120 and the bonding dielectric layer 220 before the alignment process P1.

Please continue to refer to FIG. 4. The second device wafer 200 may include a substrate 202 and an interconnecting layer 210 on the substrate 202. The bonding dielectric layer 220 is formed on the interconnecting layer 210 for wafer level bonding. The substrate 202 may be a silicon substrate, a silicon-on-insulator (SOI) substrate, a silicon germanium (SiGe) substrate, a III-V semiconductor substrate, or a substrate made of other suitable materials. A plurality of semiconductor devises 204 may be formed in the substrate 202. The semiconductor devises 204 may include transistors, diodes, capacitors, inductors, resistors, and/or any other types of active or passive electrical components, but are not limited thereto. The interconnecting layer 210 may include a dielectric portion 212 and a plurality of interconnecting structures 214 formed in the dielectric portion 212. The dielectric portion 212 may have a multilayer structure made of dielectric materials such as silicon oxide, silicon nitride, carbon-doped silicon nitride, low-k dielectric materials, or a combination thereof, but are not limited thereto. The interconnecting structures 214 may include conductive materials, such as copper (Cu), aluminum (Al), tungsten (W), titanium (Ti), titanium nitride (TiN), tantalum (Ta), tantalum nitride (TaN), other conductive metals or metal compounds, or a combination thereof, but is not limited thereto. The semiconductor devises 204 may be electrically connected to other electrical components or external circuits (not shown) through the interconnecting structures 214. In some embodiments, the interconnecting layer 210 may further include electrical components (not shown) such as capacitors, inductors, resistors, embedded memories, but are not limited thereto. The bonding dielectric layer 220 may include a dielectric material such as silicon oxide, silicon nitride, or other dielectric materials suitable for wafer level bonding process. According to an embodiment of the present invention, the bonding dielectric layer 220 may include silicon oxide. In some embodiments, the interconnecting layer 210 may include an etching stop layer 216 disposed between the dielectric portion 212 and the bonding dielectric layer 220. The etching stop layer 216 may include silicon nitride. The bonding pad 230 is disposed in the bonding dielectric layer 220 and may have a trapezoid shape. The material of the bonding pad 230 may include a metal suitable for bonding with the bonding pad 130, such as copper (Cu). According to an embodiment of the present invention, the top portion of the bonding pad 230 may be removed by over-polish of the CMP process when forming the bonding pad 230, so that the top surface 230b of the bonding pad 230 may have a recessed (or dishing) profile lower than the surface of the bonding dielectric layer 220. It is noteworthy that, at the process shown in FIG. 4, a space SP may be formed between the top surface 130b of the bonding pad 130 and the top surface 230b of the bonding pad 230.

Figure 5:
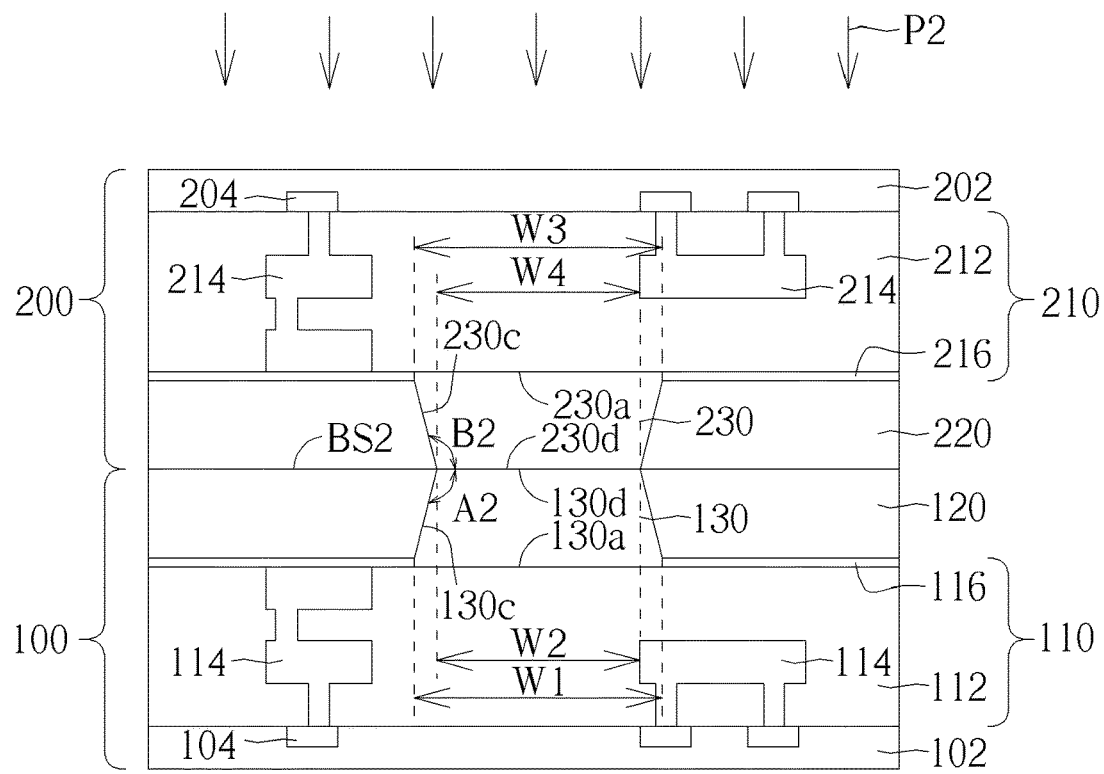

Please refer to FIG. 5. Subsequently, an anneal process P2 is performed to form covalent bonds between the bonding dielectric layer 120 and the bonding dielectric layer 220. During the anneal process P2, the metal materials (such as copper) of the bonding pad 130 and the bonding pad 230 may be thermally expanded to fill the space SP and contact with each other, allowing metal bonds formed at the interface between the bonding pad 130 and the bonding pad 230 through inter-diffusion and grain regrowth. Accordingly, the first device wafer 100 and the second device wafer 200 are bonded through hybrid bonding the bonding dielectric layer 120 to the bonding dielectric layer 220 and the bonding pad 120 to the bonding pad 230. More specifically, the hybrid bonding between the first device wafer 100 and the second device wafer 200 is obtained by performing the anneal process P2 to transfer the contact interface BS1 into the bonding interface BS2 (covalent bond interface) and thermally expand the contact pad 130 and the contact pad 230 to allow a close fit between the contact pad 130 and the contact pad 230 for forming a metal bond. According to an embodiment of the present invention, the anneal process P2 may be performed at a temperature between 40° C. and 400° C., for example, between 250° C. and 350° C., but is not limited thereto.

Please continue to refer to FIG. 5. The bonded semiconductor structure according to the first embodiment of the present invention includes a first device wafer 100 and a second device wafer 200 bonded to the first device wafer 100. The first device wafer 100 includes a substrate 102, a bonded dielectric layer 120 disposed on the substrate 102, and a bonding pad 130 disposed in the bonded dielectric layer 120. The second device wafer 200 includes a substrate 202, a bonding dielectric layer 220 disposed on the substrate 202, and a bonding pad 230 disposed in the bonding dielectric layer 220. The bonding dielectric layer 220 is bonded to the bonding dielectric layer 120 on the bonding interface BS2. The top surface 230d of the bonding pad 230 is bonded to the top surface 130d of the bonding pad 130. The bonding pad 130 includes a bottom surface 130a that is opposite to the top surface 130d and a sidewall 130c between the top surface 130d and the bottom surface 130a. A width W1 of the bottom surface 130a is larger than a width W2 of the top surface 130d, and may be, for example, 1.1 to 1.3 times of the width W2. A top angle A2 between the top surface 130d and the sidewall 130c of the bonding pad 130 is larger than 90 degrees, and may be, for example, between 105 and 120 degrees. The bonding pad 230 includes a bottom surface 230a that is opposite to the top surface 230d and a sidewall 230c between the top surface 230d and the bottom surface 230a. The bottom surface 230a has a width W3 larger than a width W4 of the top surface 230d, and may be, for example, 1.1 to 1.3 times of the width W4. A top angle B2 between the top surface 230d and the sidewall 230c of the bonding pad 230 is larger than 90 degrees, and may be, for example, between 105 and 120 degrees. The bonding pad 130 and the bonding pad 230 in this embodiment respectively have a trapezoid shape with a wider bottom portion (the portion away from the bonding interface) for providing sufficient thermal expanding volumes to fill the space SP between the bonding pad 130 and the bonding pad 230 to produce an intimate contact and reliable bonding between the bonding pad 130 and the bonding pad 230. Additionally, the trapezoid shapes of the bonding pad 130 and the bonding pad 230 may help to ease the stress generated on the bonding interface BS2 due to thermal expansions of the bonding pad 130 and the bonding pad 230, which is also beneficial for improving the bonding quality.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
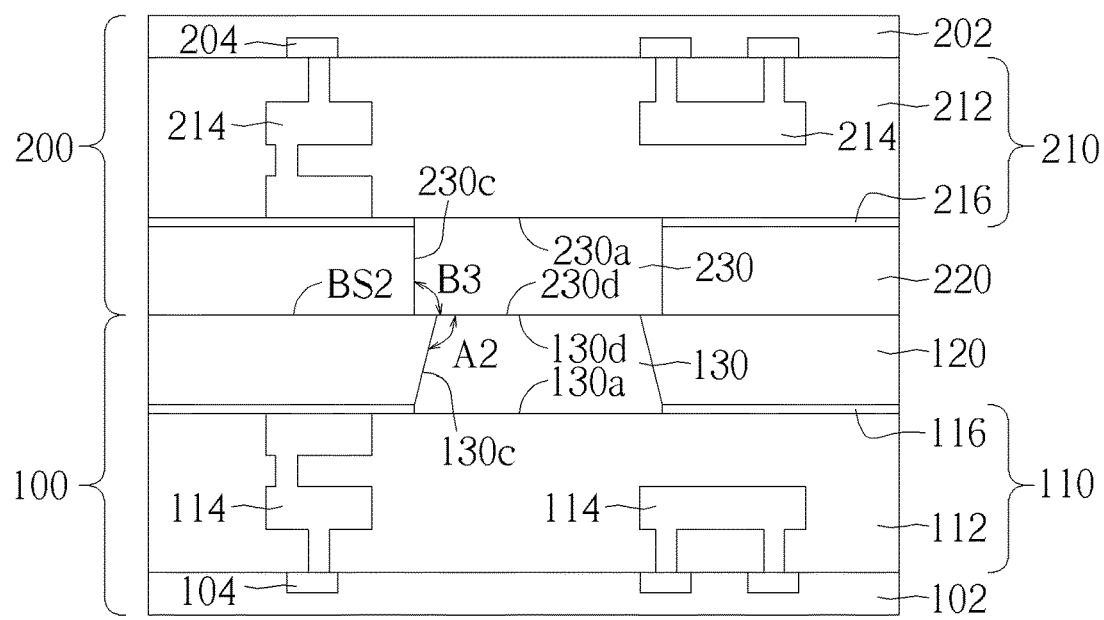
FIG. 6 is a schematic cross-sectional diagram illustrating a bonded semiconductor structure according to a second embodiment of the present invention.

Please refer to FIG. 6, which is a schematic cross-sectional diagram of a bonded semiconductor structure formed by bonding a first device wafer 100 and a second device wafer 200 according to a second embodiment of the present invention. In the second embodiment shown in FIG. 6, the top surface 230d and the bottom surface 230a of the bonding pad 230 of the second device wafer 200 may have a same width which is larger than a width of the top surface 130d of the bonding pad 130 of the first device wafer 100. This may provide a larger alignment window for the alignment process P2 to ensure a sufficient contacting area between the bonding pad 230 and the bonding pad 130 even when misalignment occurs. The bonding pad 230 shown in FIG. 6 may have a rectangular shape. The top angle B3 between the top surface 230d and the sidewall 230c of the bonding pad 230 may be approximately 90 degrees.

Figure 7:
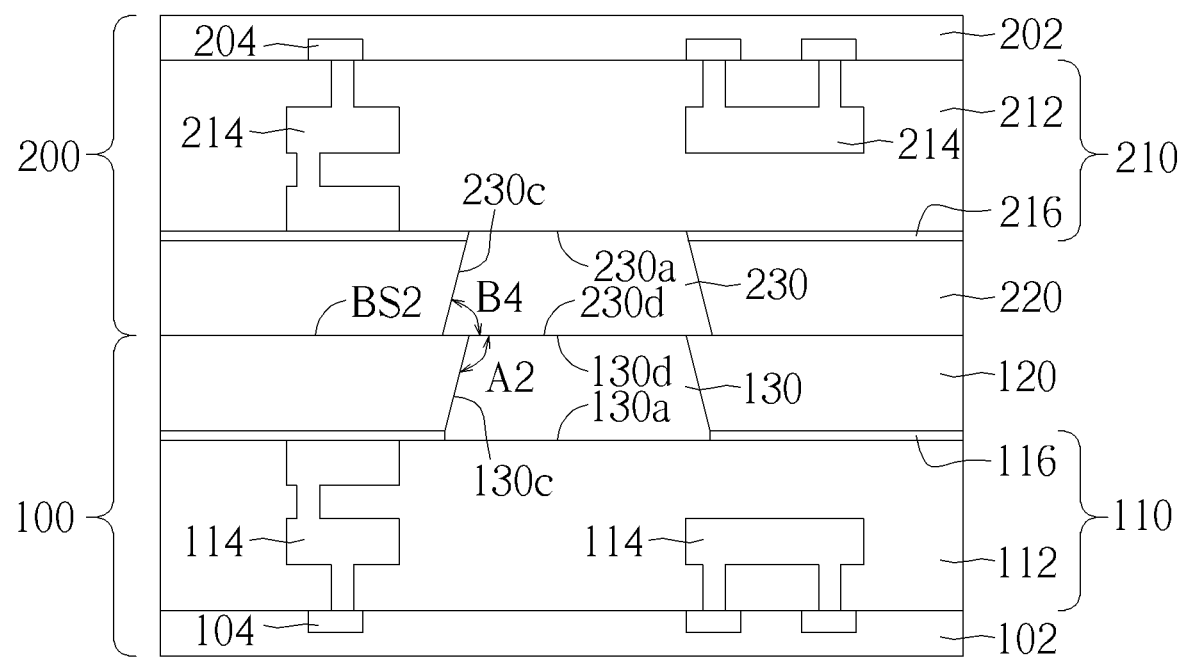
FIG. 7 is a schematic cross-sectional diagram illustrating a bonded semiconductor structure according to a third embodiment of the present invention.

Please refer to FIG. 7, which is a schematic cross-sectional diagram of a bonded semiconductor structure formed by bonding a first device wafer 100 and a second device wafer 200 according to a third embodiment of the present invention. The top surface 230d of the bonding pad 230 of the second device wafer 200 may has a width larger than a width of the bottom surface 230a of the bonding pad 230 and a width of the top surface 130d of the bonding pad 130 of the first device wafer 100. The bonding pad 230 shown in FIG. 7 may have a trapezoid shape, and the top angle B4 between the top surface 230d and the sidewall 230c of the bonding pad 230 is smaller than 90 degrees.

Figure 8:
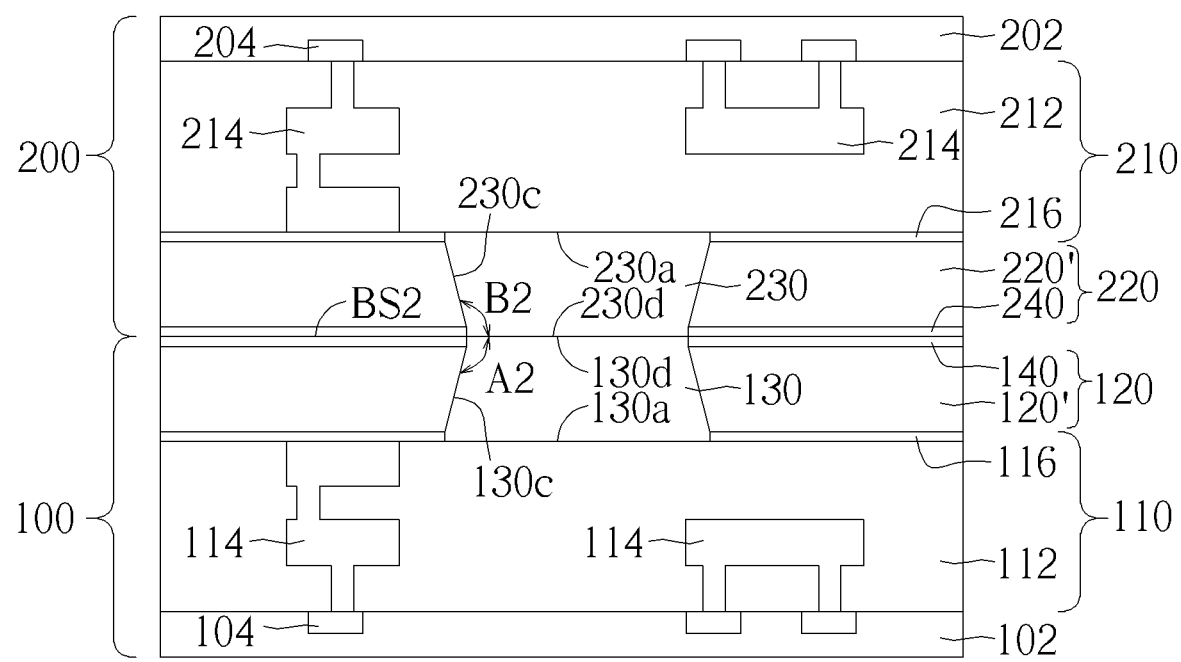
FIG. 8 is a schematic cross-sectional diagram illustrating a bonded semiconductor structure according to a fourth embodiment of the present invention.

Please refer to FIG. 8, which is a schematic cross-sectional diagram of a bonded semiconductor structure formed by bonding a first device wafer 100 and a second device wafer 200 according to a fourth embodiment of the present invention. As shown in FIG. 8, the bonding dielectric layer 120 may include a silicon oxide layer 120' and a silicon nitride layer 140 on the silicon oxide layer 120'. The bonding dielectric layer 220 may include a silicon oxide layer 220' and a silicon nitride layer 240 on the silicon oxide layer 220'. The second device wafer 200 is bonded to the first device wafer 100 by bonding the silicon nitride layer 240 and the silicon nitride layer 140 on the bonding interface BS2 and bonding the top surface 230d of the bonding pad 230 of the second device wafer 200 and the top surface 130d of the bonding pad 120 of the first device wafer 100. When misalignment occurs during the alignment process P1, the silicon nitride layer 140 and the silicon nitride layer 240 may prevent defects caused by diffusions of the metal materials of the bonding pad 230 and/or the bonding pad 130.

Figure 9:
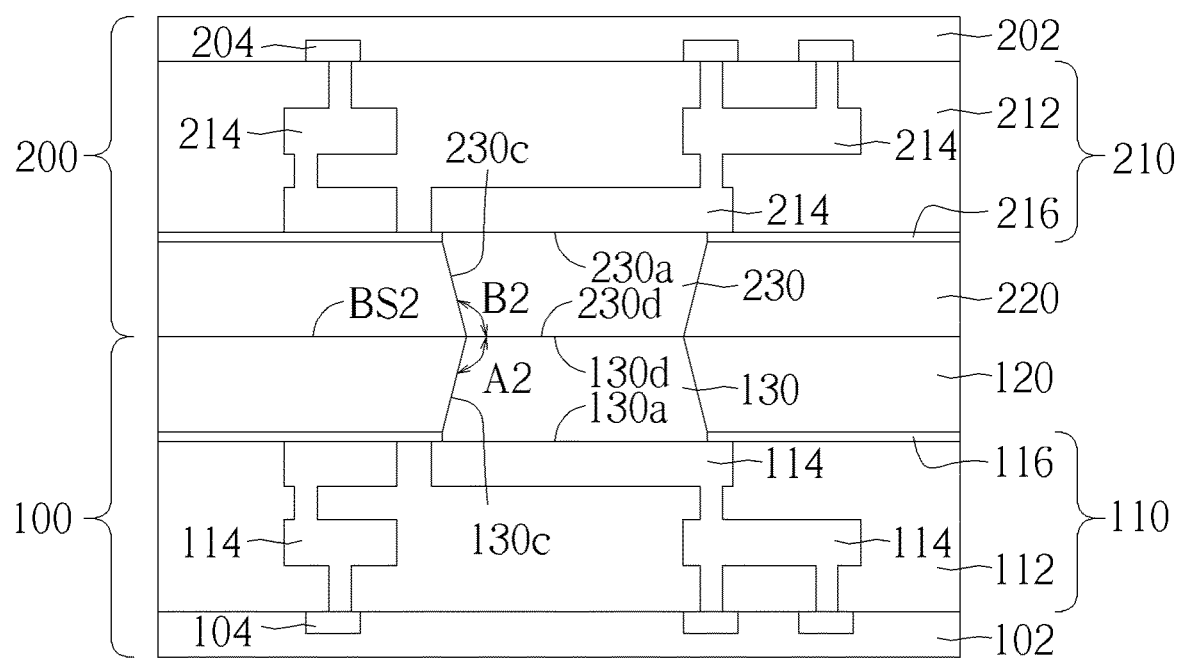
FIG. 9 is a schematic cross-sectional diagram illustrating a bonded semiconductor structure according to a fifth embodiment of the present invention.

Please refer to FIG. 9, which is a schematic cross-sectional diagram of a bonded semiconductor structure formed by bonding a first device wafer 100 and a second device wafer 200 according to a fifth embodiment of the present invention. As shown in FIG. 9, the bottom surface 130a of the bonding pad 130 may contact and electrically connect to an interconnecting structure 114 in the interconnecting layer 110 of the first device wafer 100. Likewise, the bottom surface 230a of the bonding pad 230 may contact and electrically connect to an interconnecting structure 214 in the interconnecting layer 210 of the second device wafer 200. The bonding pad 130 and the bonding pad 230 may be used to transmit signals between the first device wafer 100 and the second device wafer 200.

Figure 10:
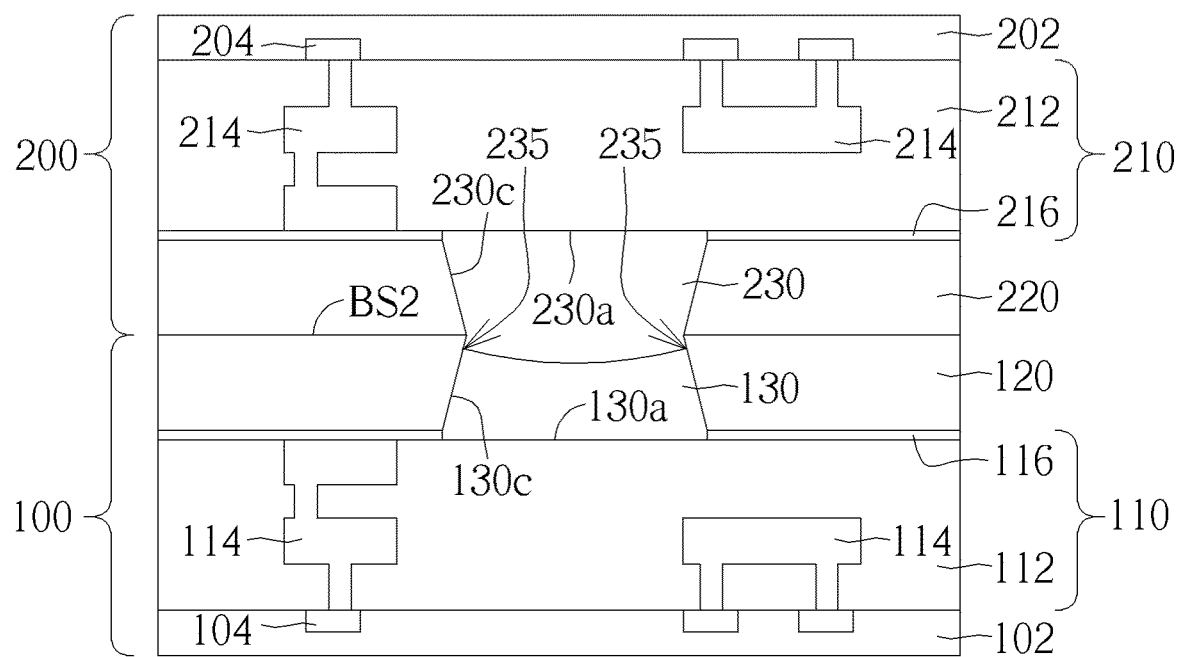
FIG. 10 is a schematic cross-sectional diagram illustrating a bonded semiconductor structure according to a sixth embodiment of the present invention.

Please refer to FIG. 10, which is a schematic cross-sectional diagram of a bonded semiconductor structure formed by bonding a first device wafer 100 and a second device wafer 200 according to a sixth embodiment of the present invention. By respectively controlling the CMP process to control the removed amounts of the top portions of the bonding pad 130 and the bonding pad 230, the recessed or protruding profiles of the top portions of the bonding pad 130 and the bonding pad 230 may be adjusted relatively as required. For example, the top surface of the bonding pad 130 may have a deeper recessed profile and may expose the upper side wall of the opening 122 (shown in FIG. 3) after the CMP process. In accordance with the recessed profile of the bonding pad 130, the top surface of the bonding pad 230 may have a shallower recessed profile, or may be substantially flush with the surface of the bonding dielectric layer 220, or may protrude from the surface of the bonding dielectric layer 220 after the CMP process. Accordingly, after the anneal process P2 to bonding the first device wafer 100 and the second device wafer 200, the top portion of the bonding pad 230 may protrude toward the bonding pad 130 to fill more of the space between the bonding pad 230 and the bonding pad 130. As shown in FIG. 10, the top corners 235 of the portion of the bonding pad 230 bonded to the bonding pad 130 may extend outwardly along a lateral direction, and the sidewalls of the top corners 235 are in direct contact with the bonding dielectric layer 120.

In summary, the present invention provides a semiconductor structure with a trapezoid shaped bonding pad for wafer level bonding, which may ensure an intimate contact and a reliable bonding between the bonding pad and an associated bonding pad of another semiconductor structure, and may also help to ease the stress generated on the bonding interface, such that an improved bonding quality may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure for wafer level bonding, including:
   an interconnecting layer on a substrate;
   a bonding dielectric layer on the interconnecting layer; and
   a bonding pad in the bonding dielectric layer, comprising:
      a top surface exposed from the bonding dielectric layer;
      a bottom surface opposite to the top surface and physically contacting a dielectric portion of the interconnecting layer; and
      a sidewall between the top surface and the bottom surface, wherein a bottom angle between the sidewall and the bottom surface is smaller than 90 degrees, and the bonding pad is not electrically connected to the interconnecting layer.

2. The semiconductor structure for wafer level bonding according to claim 1, further comprising an etching stop layer between the interconnecting layer and the bonding dielectric layer and physically contacting the sidewall of the bonding pad.

3. The semiconductor structure for wafer level bonding according to claim 1, wherein the bottom angle is between 60 and 85 degrees.

4. The semiconductor structure for wafer level bonding according to claim 1, wherein a width of the bottom surface is larger than a width of the top surface.

5. The semiconductor structure for wafer level bonding according to claim 1, wherein the top surface has a recessed profile.

6. The semiconductor structure for wafer level bonding according to claim 1, wherein the bonding pad comprises copper.

7. The semiconductor structure for wafer level bonding according to claim 1, wherein the bonding dielectric layer comprises a silicon oxide layer and the top surface of the bonding pad is exposed from a surface of the silicon oxide layer.

8. The semiconductor structure for wafer level bonding according to claim 1, wherein the bonding dielectric layer comprises a silicon oxide layer and a silicon nitride layer on the silicon oxide layer, wherein the top surface of the bonding pad is exposed from a surface of the silicon nitride layer.

9. A bonded semiconductor structure, comprising:
   a first device wafer, comprising:
      a first interconnecting layer on a first substrate;
      a first bonding dielectric layer on the first interconnecting layer; and
      a first bonding pad through the first bonding dielectric layer and physically contacting a dielectric portion the first interconnecting layer, wherein the first bonding pad is not electrically connected to the first interconnecting layer; and
   a second device wafer, comprising:
      a second interconnecting layer on a second substrate;
      a second bonding dielectric layer on the second interconnecting layer and bonded to the first bonding dielectric layer; and
      a second bonding pad in the second bonding dielectric layer and bonded to a top surface of the first bonding pad, wherein a first angle between the top surface and a sidewall of the first bonding pad is larger than 90 degrees.

10. The bonded semiconductor structure according to claim 9, wherein the first angle is between 105 and 120 degrees.

11. The bonded semiconductor structure according to claim 9, wherein the first bonding pad further comprises a bottom surface opposite to the top surface, and a width of the bottom surface is larger than a width of the top surface.

12. The bonded semiconductor structure according to claim 9, wherein the first bonding pad and the second bonding pad respectively comprise copper.

13. The bonded semiconductor structure according to claim 9, wherein the first bonding dielectric layer and the second bonding dielectric layer respectively comprise a silicon oxide layer.

14. The bonded semiconductor structure according to claim 9, wherein the first bonding dielectric layer and the second bonding dielectric layer respectively comprise a silicon oxide layer and a silicon nitride layer, and the silicon nitride layer of the first bonding dielectric layer and the silicon nitride layer of the second bonding dielectric layer are bonded to each other.

15. The bonded semiconductor structure according to claim 9, wherein the first bonding pad and the second bonding pad respectively comprise copper.

16. The bonded semiconductor structure according to claim 9, further comprising a first etching stop layer between the first interconnecting layer and the first bonding dielectric layer and physically contacting the sidewall of the first bonding pad.

17. The bonded semiconductor structure according to claim 9, wherein a second angle between a sidewall of the second bonding pad and a top surface of the second bonding pad bonding to the top surface of the first bonding pad is larger than 90 degrees.

18. The bonded semiconductor structure according to claim 17, further comprising a second etching stop layer between the second interconnecting layer and the second bonding dielectric layer and physically contacting the sidewall of the second bonding pad.

19. The bonded semiconductor structure according to claim 9, wherein the second bonding pad is not electrically connected to the second interconnecting layer.

20. The bonded semiconductor structure according to claim 9, wherein a second angle between a sidewall of the second bonding pad and a top surface of the second bonding pad bonding to the top surface of the first bonding pad is different from the first angle.

* * * * *